United States Patent [19]
Reddick et al.

[11] Patent Number: 6,033,101
[45] Date of Patent: Mar. 7, 2000

[54] CABLE TELEVISION RADIO FREQUENCY AND AC POWER MULTITAP

[75] Inventors: Donald W. Reddick, Thornton; Dennis Jay Mc Lain, Arvada; Scott R. Smith, Boulder, all of Colo.

[73] Assignee: Antec Corporation, Rolling Meadows, Ill.

[21] Appl. No.: 08/350,801

[22] Filed: Dec. 7, 1994

[51] Int. Cl.[7] .................................................. H04N 5/14
[52] U.S. Cl. .................... 364/514 R; 348/707; 348/730; 455/3.3; 333/131
[58] Field of Search ........................ 364/514 R; 348/707, 348/730; 340/310.01; 455/3.3; 333/131; 307/112

[56] References Cited

U.S. PATENT DOCUMENTS

| | | | |
|---|---|---|---|
| 3,699,272 | 10/1972 | Fritz | 179/170 |
| 3,860,748 | 1/1975 | Everhart et al. | 178/6 |
| 3,987,240 | 10/1976 | Schultz | 178/6 |
| 4,912,553 | 3/1990 | Pal et al. | 358/86 |
| 4,963,966 | 10/1990 | Harney et al. | 358/349 |
| 5,096,444 | 3/1992 | Lu et al. | 439/750 |
| 5,151,838 | 9/1992 | Dockery | 340/310 R |
| 5,179,334 | 1/1993 | Reddick | 323/355 |
| 5,237,295 | 8/1993 | Reddick et al. | 333/131 |
| 5,345,592 | 9/1994 | Woodmas | 455/3.3 |
| 5,381,050 | 1/1995 | Siclari et al. | 307/112 |
| 5,384,603 | 1/1995 | Strauss et al. | 348/730 |
| 5,440,335 | 8/1995 | Beveridge | 348/13 |
| 5,467,384 | 11/1995 | Skinner, Sr. | 379/66 |
| 5,481,478 | 1/1996 | Palmieri et al. | 364/514 R |
| 5,482,208 | 1/1996 | Spriester | 333/131 |

*Primary Examiner*—Emanuel T. Voeltz
*Assistant Examiner*—Patrick J. Assouad

[57] ABSTRACT

A tap for delivering electrical power and video signals to subscriber substations includes an input coupling module for coupling a main video signal and a main power signal from a cable conductor to the tap. Means are provided for generating a subscriber video signal and a subscriber power signal by extracting portions of the signals from the main cable. The subscriber video signals and subscriber power signals then are transmitted to subscriber substations. Communication devices in the subscriber substations can be powered by the subscriber power signal in the absence of electrical power from a power utility.

46 Claims, 16 Drawing Sheets

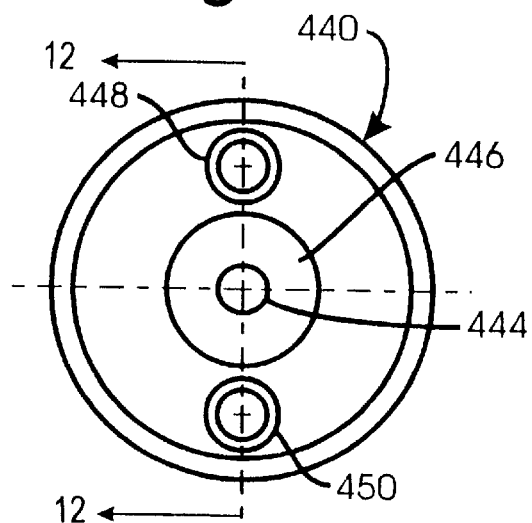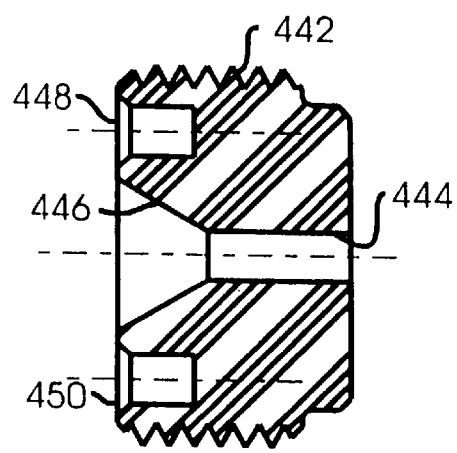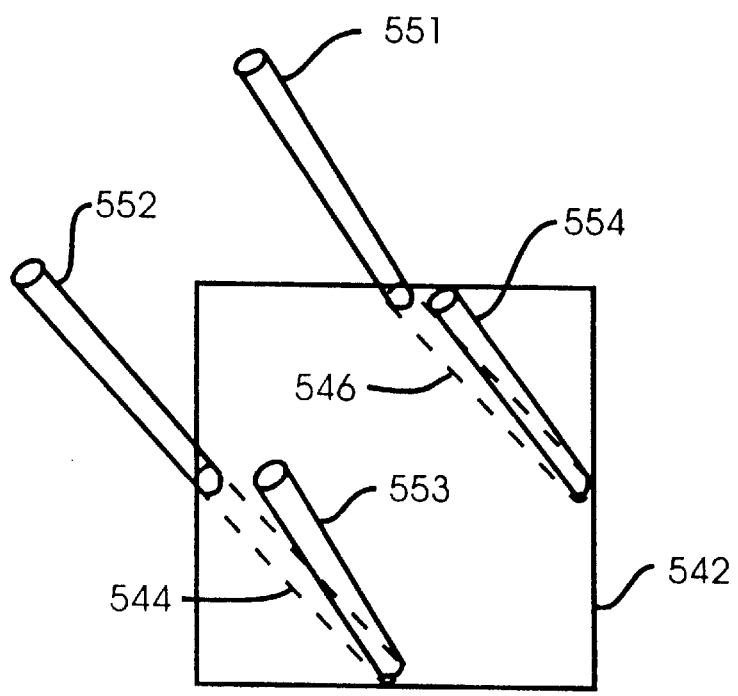

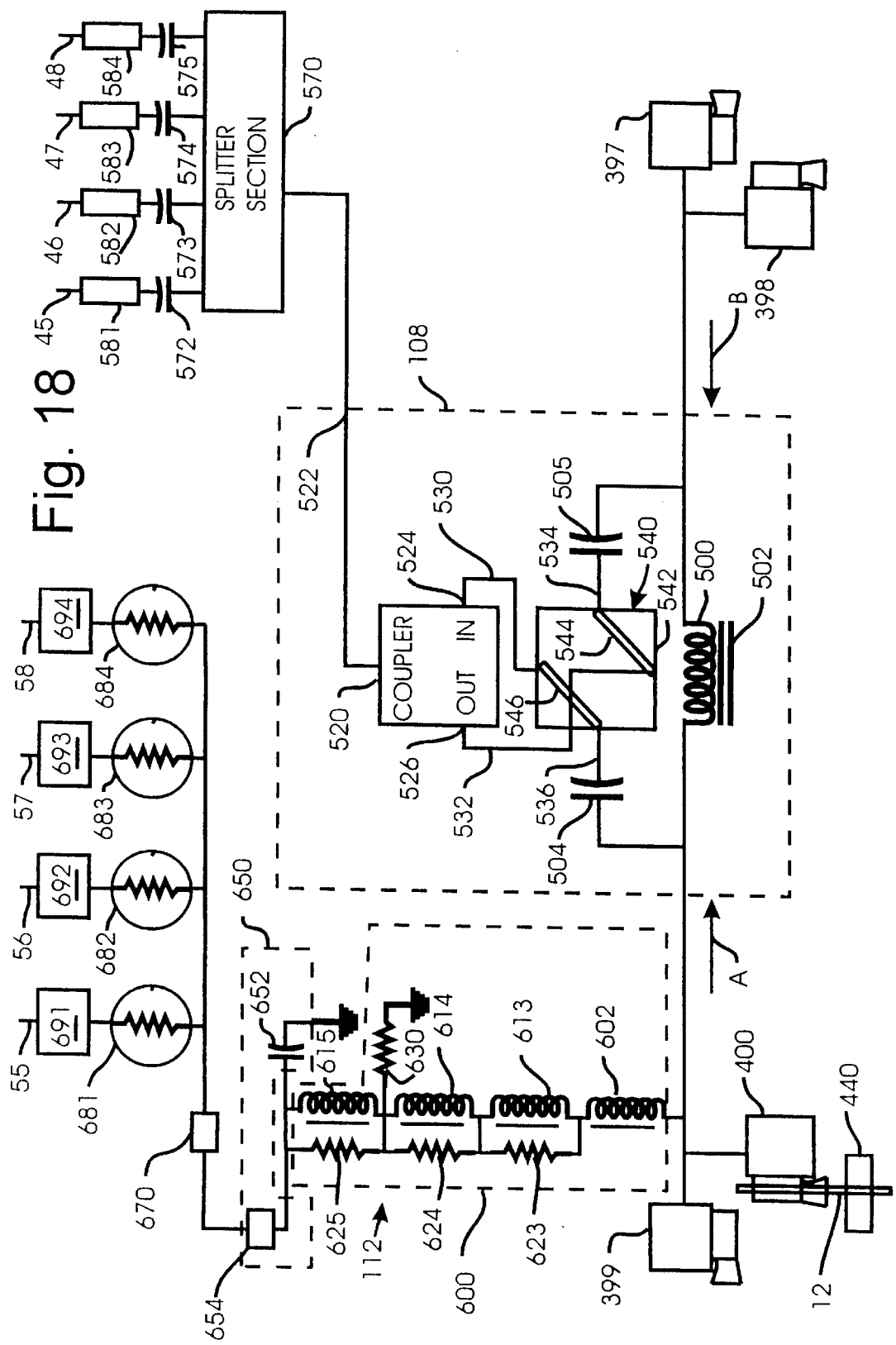

CABLE TELEVISION RADIO FREQUENCY AND AC POWER MULTITAP

FIELD OF THE INVENTION

This invention relates to cable television, and more particularly relates to a tap for delivering electrical power to subscriber substations from a main cable capable of transmitting a main video signal and a main power signal on a cable conductor.

BACKGROUND OF THE INVENTION

Systems for distributing information to subscriber substations have been known for some time, but their limitations have inhibited the growth of cable communications. In the past, such systems have delivered television signals via a main cable that transmits a main video signal carrying the television information. In some such cables, the cable conductor also has carried a 60 cycle AC main power signal in order to provide power for amplifiers used to amplify weak video signals on the cable.

Recent developments in cable technology have placed increased demands on the ability of the cable to provide not only video signals, but also power signals to subscriber substations. As far as the applicants are aware, no one has successfully developed a tap capable of providing both a video signal and a power signal to a plurality of subscriber substations. Obtaining AC power signals from a main cable transmitting both video and power signals is complicated by the increased bandwidth required for improved cable video operation. At the present time, such a bandwidth typically extend from about 5 megahertz to over 1 gigahertz.

The applicants have discovered techniques for supplying AC power signals to a multiplicity of subscriber substations with only a minimal loss to the video signal. For example, in a typical tap for supplying subscriber substations, the applicants have been able to supply power from the cable power signal with an increase in insertion loss of only about 0.2 decibels of radio frequency energy from the video signal when compared to a tap that does not supply power to the substation.

In addition to supplying a power signal to multiple subscriber substations with minimal loss to video energy, there also is a need for a tap capable of supplying both video and power signals to subscriber substations, irrespective of the direction in which the video signal is transmitted on the main cable, without rewiring existing taps or drop lines to the subscriber substations.

There also is a need for limiting current supplied by power signals to subscriber substations and limiting the amount of radio frequency electromagnetic energy that is emitted by a tap serving subscriber substations.

The cable television industry has long sought a means of quickly connecting a cable conductor to a tap without creating variable capacitance and without requiring undue labor by an installer. In addition, the coupling technique must match as nearly as possible the characteristic impedance of the cable conductor.

Each of the foregoing deficiencies in the prior cable television taps has been overcome by using the unique techniques described and claimed in the specification.

SUMMARY OF THE INVENTION

The invention is suitable for use in connection with a system for distributing information to subscriber substations, including a main cable for transmitting a main video signal and a main power signal on a cable conductor having a predetermined cable characteristic impedance. It has been discovered that both video signals and power signals can be supplied from the cable conductor to numerous subscriber substations by providing a first means for coupling the video signal and the main power signal from a cable conductor to an improved tap. Means are provided in the tap for generating a subscriber video signal by extracting a predetermined portion of the main video signal received from the first coupling means. The extracted subscriber video signal is transmitted to the subscriber substations on video cable. A subscriber power signal is also generated by extracting a predetermined portion of the main power signal received from the first coupling means. The extracted subscriber power signal is transmitted to the subscriber substations on subscriber power lines. Preferably, the subscriber video cable and subscriber power lines are combined into a single cable. The unextracted portion of the main video signal and the main power signal are transmitted to a second main cable which may extend to additional taps capable of supplying additional subscriber substations.

Another feature of the invention is useful in a tap for delivering power and video signals to subscriber substations from a main cable transmitting a main video signal and a main power signal on a cable conductor having a predetermined cable characteristic impedance. The applicants have discovered that the installation of the cable in the tap is greatly simplified by using a clip for receiving the cable conductor. Preferably, the clip includes first and second opposed gripping surfaces for gripping the cable conductor and a spring section for urging the first and second gripping surfaces toward each other with a predetermined force. By using this technique, the variability of capacitance between the first and second opposing gripping surface and the cable conductor is reduced.

Another aspect of the invention is useful in a tap for delivering video signals to subscriber substations from a main cable transmitting a main video signal and a main power signal on a cable conductor having a predetermined cable characteristic impedance. The tap includes a port having a threaded inner wall and a circuit presenting a predetermined terminal impedance to the main cable different from the characteristic impedance of the cable. The applicants have discovered an improved insert for guiding the cable conductor through the port and for adjusting the terminal impedance to more nearly equal the characteristic impedance. Preferably, the insert includes a body defining a hole having a diameter larger than the diameter of the cable conductor and also having a generally conical funnel for guiding the cable conductor through the hole. The funnel also guides the cable conductor into the previously described clip. By using this feature, the terminal impedance of the tap may be adjusted to more nearly equally characteristic impedance of the cable. The previously described clip and the insert may be combined to provide an improved means of coupling the cable to the tap with a degree of efficiency, ease and impedance matching capability unappreciated by the prior art.

Another feature of the invention is useful in connection with a tap for delivering video signals to subscriber substations from a main cable transmitting a main video signal and a main power signal to a cable conductor. The tap preferably includes a circuit for extracting a predetermined portion of the main video signal for transmission to the subscriber substations. The applicants have discovered improved apparatus for confining electromagnetic radiation inside the tap and for preventing rain and other environmental contaminants from entering the tap. These results are achieved by providing a housing comprising a metal cover including a first groove defining a closed curve and a first tongue also defining a closed curve. A metal base including a second groove defining a closed curve and a second tongue also defining a closed curve is also provided. The second tongue is inserted in the first groove in contacting relationship in order to prevent electromagnetic radiation from escaping from the housing. The combination also includes an integrally formed seal having a first member inserted in the second groove and having a second member engaged by the first tongue. By using these techniques, the cover and base define a closed chamber for enclosing the circuit for extracting the predetermined portion of the main video signal. The closed chamber confines electromagnetic radiation inside and inhibits water from entering the closed chamber while facilitating assembly and reducing costs.

Another aspect of the invention is useful in a tap for delivering video signals to subscriber substations from a main cable transmitting a main video signal and a main power signal on a cable conductor. The tap includes an input port for receiving the main cable and a coupler for generating a subscriber video signal by extracting a predetermined portion of the main video signal. The coupler also includes an input for receiving the main video signal, a first output for transmitting the extracted predetermined portion of the main video signal and a second output for transmitting an unextracted portion of the main video signal to an output port. The applicants have discovered improved apparatus for reversing the connections between the first and second ports, the input and the second output. Preferably, the reversing apparatus includes a first conductor coupled to the input of the coupler, a second conductor coupled to the second output of the coupler, a third conductor coupled to the input port, and a fourth conductor coupled to the output port. A base is movable between first and second positions. A fifth conductor is mounted on the base and is operable when the base is in the first position for coupling the first and fourth conductors and is operable when the base is in the second position for coupling the first and third conductors. A sixth conductor also is mounted on the base and is operable when the base is in the first position for coupling the second and third conductors and is operable when the base is in the second position for coupling the second and fourth conductors. By moving the base between the first and second positions, the main video signal can be coupled to the input of the coupler, irrespective of whether the main video signal is received through the input port or through the output port. These techniques provide an inexpensive and efficient means of using previously installed taps and lines to subscriber substations even in the event that the direction of the video signal on the main cable must be changed.

Another aspect of the invention is useful in a tap for delivery video signals to subscriber substations from a main cable transmitting a main video signal having a predetermined pass band and a main power signal on a cable conductor. The tap includes a coupler for generating a subscriber video signal by extracting a predetermined portion of the main video signal. The applicants have discovered that power can be supplied to the subscriber substations from the main cable by providing a means for generating a subscriber power signal by extracting a predetermined portion of the main power signal. Preferably, the means for generating has a resonant frequency outside the pass band of the cable. The subscriber power signal is transmitted to the subscriber substations. Using such techniques, reliable AC power signals can be provided to numerous subscriber substations from a main cable carrying both video and power signals with a degree of efficiency and economy previously unknown.

Yet another feature of the invention may be used in a tap for delivering video signals to subscriber substations from a main cable transmitting a main video signal and a main power signal on a cable conductor. The tap preferably includes a coupler for generating a subscriber video signal by extracting a predetermined portion of the main video signal. The main cable comprises a first shield connected to ground at a location remote from the subscriber substation. The subscriber substation comprises a subscriber ground connection connected to ground adjacent the subscriber substation. The extracted predetermined portion of the main video signal is transmitted to the subscriber substations on a line having second shield connected to the subscriber ground connection and a line signal conductor for transmitting the subscriber video signal to the subscriber substation. The applicants have discovered that improved video performance is achieved by providing a high pass filter for filtering frequencies below the pass band from the line signal conductor. By using these techniques, hum modulation distortion of the subscriber video signal is substantially reduced.

BRIEF DESCRIPTION OF THE DRAWINGS

These and other objects, advantages and features of the invention will hereafter appear for purposes of illustration, but not of limitation, in connection with the following drawings, wherein like numbers refer to like parts throughout, and wherein:

FIG. 11 is a front elevational view of a preferred form of insert made in accordance with one aspect of the invention;

FIG. 12 is a cross sectional view taken along line 12—12 of FIG. 11;

FIG. 18 is an illustration of the circuitry as shown in FIG. 17 with a reversing block rotated to reverse the connections for part of the circuit;

FIG. 19 is a diagrammatic view of the reversing block shown in FIGS. 17 and 18.

DESCRIPTION OF THE PREFERRED EMBODIMENTS

Figure 1:
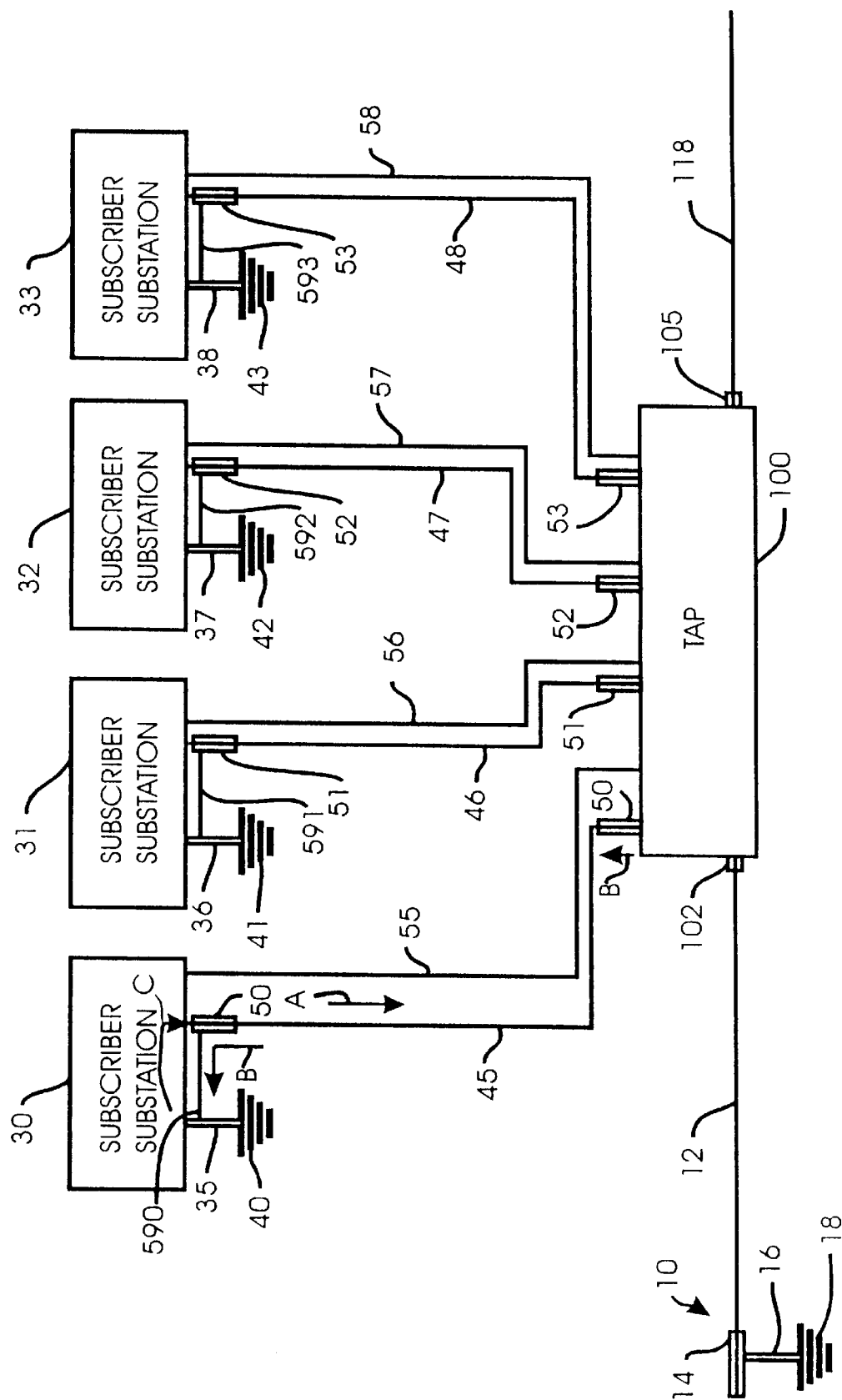
FIG. 1 is a schematic, fragmentary block diagram illustrating an exemplary group of subscriber substations that are connected to a tap made in accordance with a preferred mode of the present invention.

Referring to FIG. 1, the preferred embodiment of the invention may be used in connection with a main coaxial cable 10 of a cable television system that includes a center cable conductor 12 surrounded by a shield 14 throughout substantially the entire length of conductor 12. The cable conductor and shield are separated by a dielectric (not shown). Shield 14 is connected through a ground connection 16 to a ground point 18. Cable conductor 12 transmits a main video signal having a pass band from 5 megahertz to at least 1 gigahertz. Conductor 12 also transmits a 60 hertz 60 volt AC main power signal.

The applicants have discovered that cable 10 may be used to supply both video signals and power signals to a multiplicity of subscriber substations (e.g., residential homes). Four exemplary substations 30–33 are illustrated in FIG. 1. The subscriber substations may include communication devices, such as telephones, which must have power independent of the normal AC electrical power supplied by electrical utilities. The electrical systems and the subscriber substations are connected through ground conductors 35–38 to ground points 40–43, respectively. Points 40–43 are remote from ground point 18. Video signals corresponding to the video signal on cable 10 are supplied through coaxial line signal conductors 45–48 that are protected by metallic shields 50–53 throughout substantially their entire length. A substantial portion of the length of shields 50–53 has been removed in FIG. 1 for clarity.

The applicants have discovered techniques disclosed in the specification for also supplying to substations 30–33 with subscriber AC power signals extracted from cable 10. The subscriber power signals are transmitted over power line conductors 55–58. Each of conductors 55–58 preferably comprises a twisted pair of conductors. Preferably, conductors 45–48, 55–58 and shields 50–53 are combined in a single cable that can be conveniently routed to subscriber substations.

Figure 2:
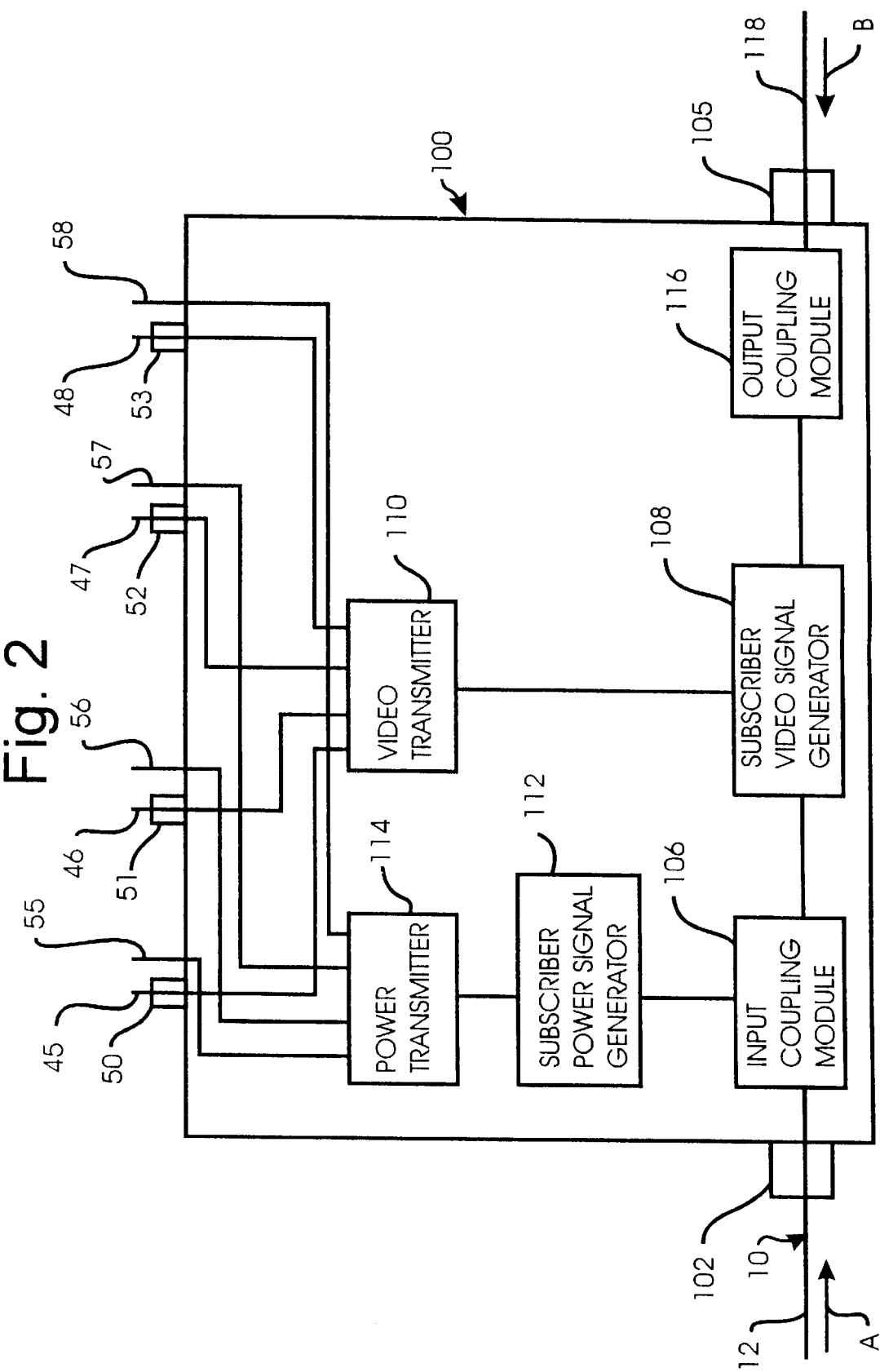
FIG. 2 is a schematic system block diagram of the tap shown in FIG. 1.
Figure 16:
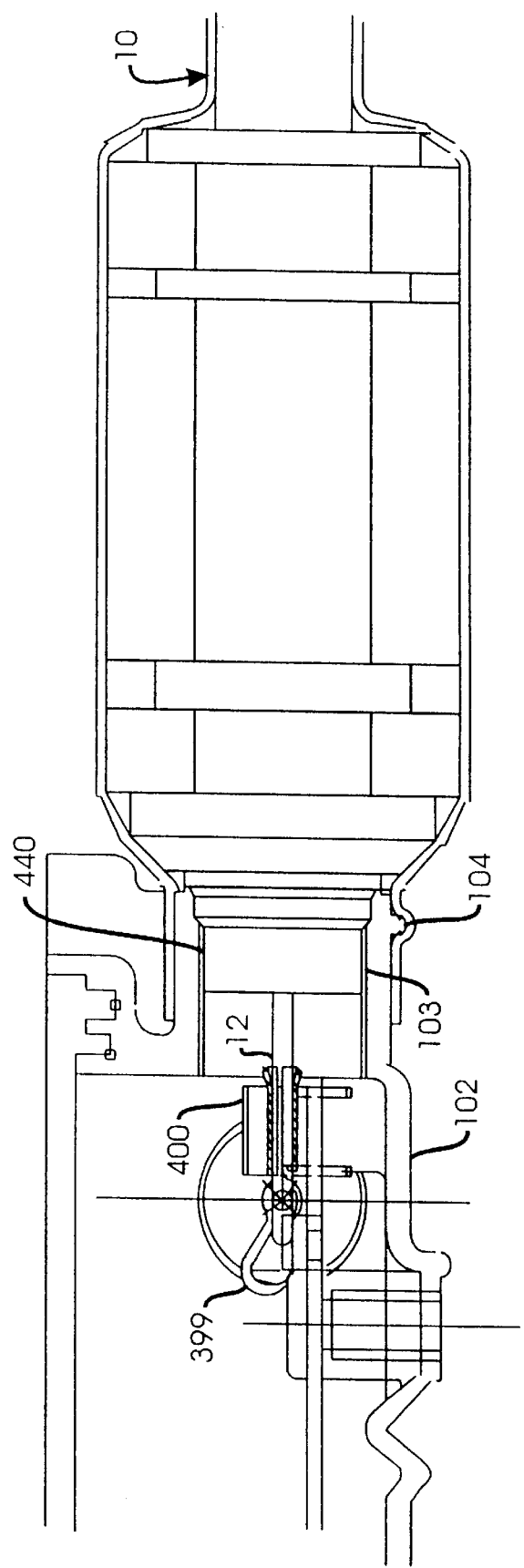
FIG. 16 is a cross sectional view taken along line 16—16 in FIG. 15.

Referring to FIG. 2, unique tap 100 capable of supplying from cable 10 both video signals and power signals to subscriber substations 30–33 includes an input port 102 having internal threads 103 (FIG. 16) and a mounting ridge 104 (FIG. 16). Tap 100 also includes an output port 105 constructed identically to input port 102.

Still referring to FIG. 2, tap 100 basically includes an input coupling module 106, a subscriber video signal generator 108, a video transmitter 110, a subscriber power signal generator 112, power transmitter 114, and an output coupling module 116, all connected as shown. As will be explained in more detail later, video signal on cable conductor 12 may proceed in the direction of arrow A or in the direction of arrow B without requiring any rewiring or reorientating of the circuitry shown in FIG. 2, other than the simple rotation of a reversing block. Assuming that the video signal on cable conductor 12 is proceeding in the direction of arrow A, output port 105 is connected to an additional cable 118 identical to cable 10. Cable 118 may be connected to additional taps, such as tap 100, and additional subscriber substations, such as substations 30–33.

Figure 3:
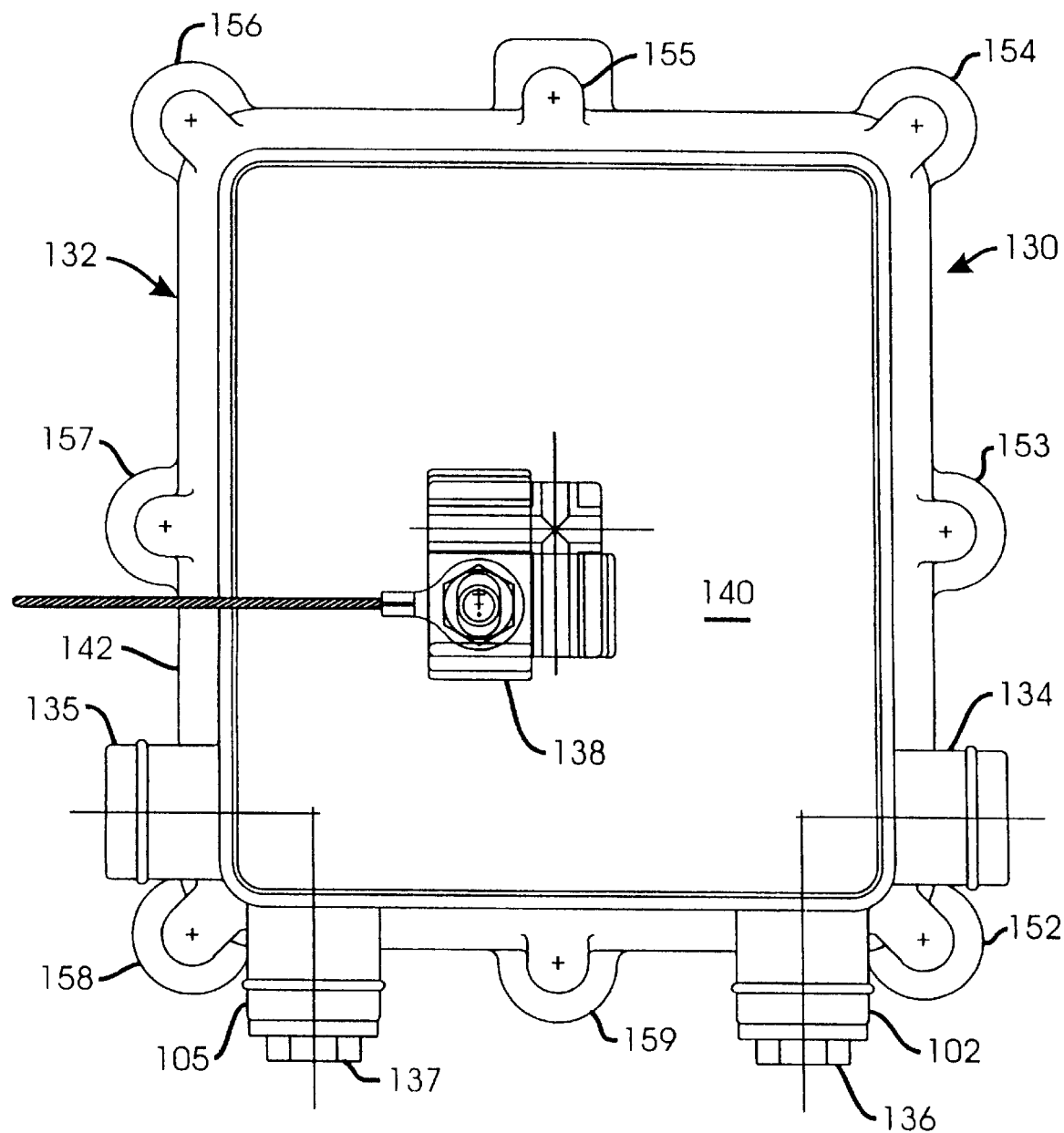
FIG. 3 is a bottom plan view of a preferred form of case for the tap illustrated in FIG. 1.

Referring to FIGS. 3–6, tap 100 is enclosed by and supported by a tap case 130 comprising a metal base 132. Base 132 is fitted with alternate ports 134 and 135 that may be used as input and output ports in place of ports 102 and 105, depending on the orientation of the tap case during installation. As shown in FIG. 3, ports 102 and 105 are closed by threaded plugs 136 and 137. The plugs may be removed from ports 102 and 105 and threaded into ports 134 and 135 in the event that ports 102 and 105 are connected to cables 10 and 118.

Each of ports 102, 105, 134 and 135 is identical and may receive cable 10 or 118.

Tap case 130 includes a clamp 138 (FIG. 3) bolted to a bottom plate 140 in order to facilitate installation. Base 132 also includes sidewalls 142 that are cast to include a tongue 144 (FIGS. 5 and 6A) defining a closed curve and a companion groove 145 also defining a closed curve. Groove 145 has an inverted trapezoid shape that defines sidewalls 146 and 147.

Base 132 includes mounting flanges 152–159 that are integrally formed with sidewall 142.

Figure 4:
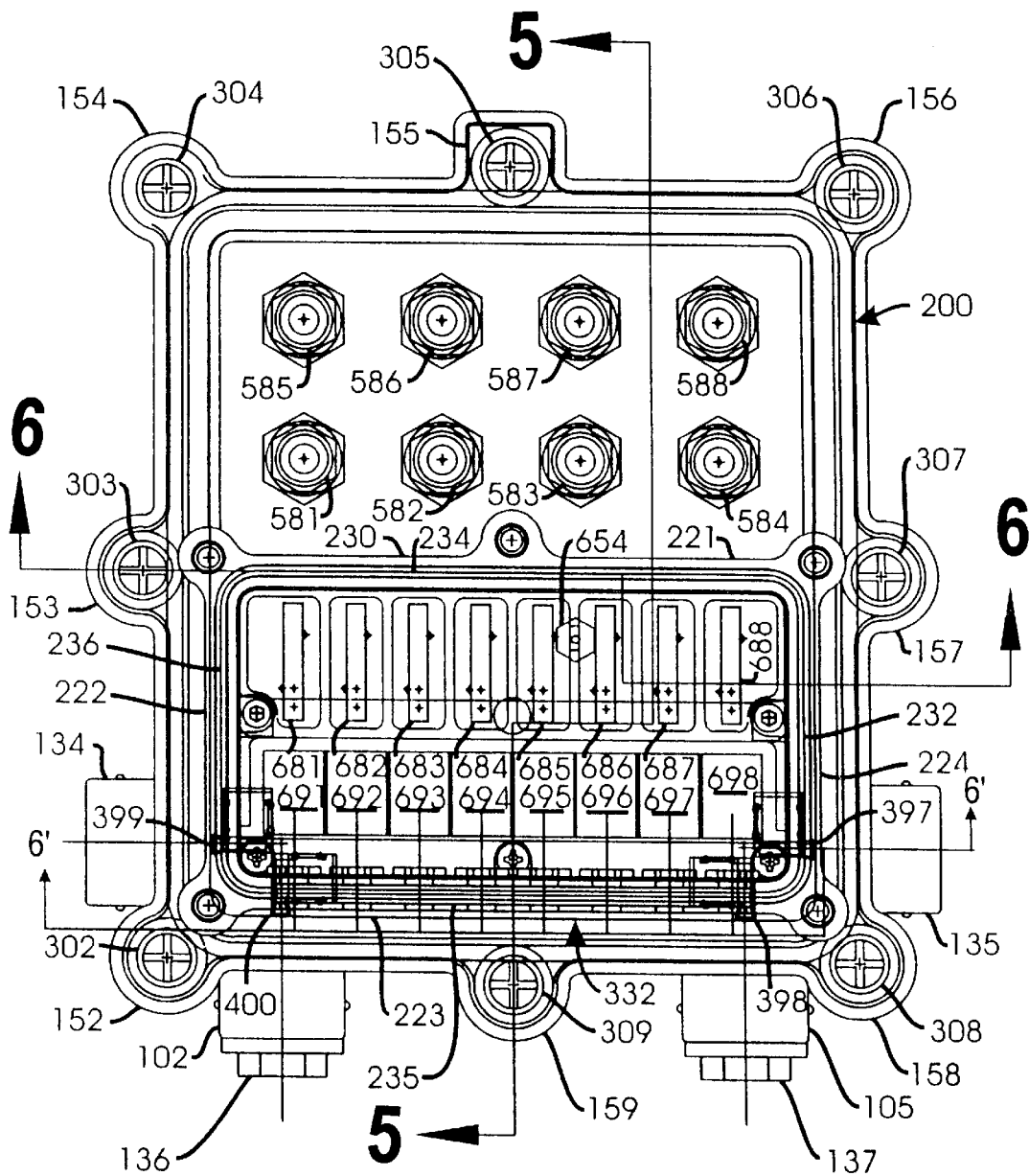
FIG. 4 is a top plan view of the tap case shown in FIG. 3 from which one of the covers has been removed for clarity.
Figure 5:
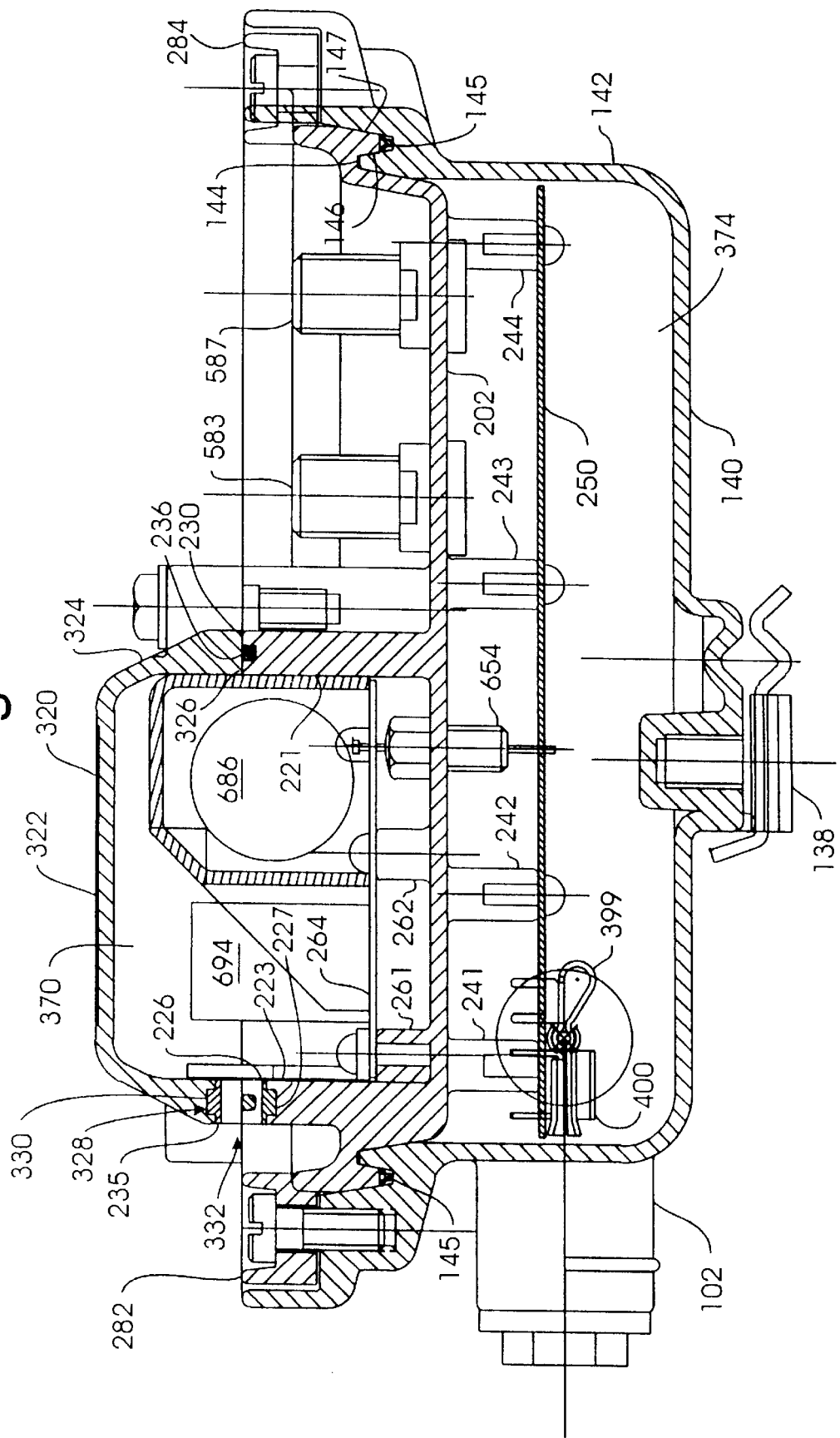
FIG. 5 is a cross sectional view of the tap case taken along line 5—5 in FIG. 4.
Figure 6:
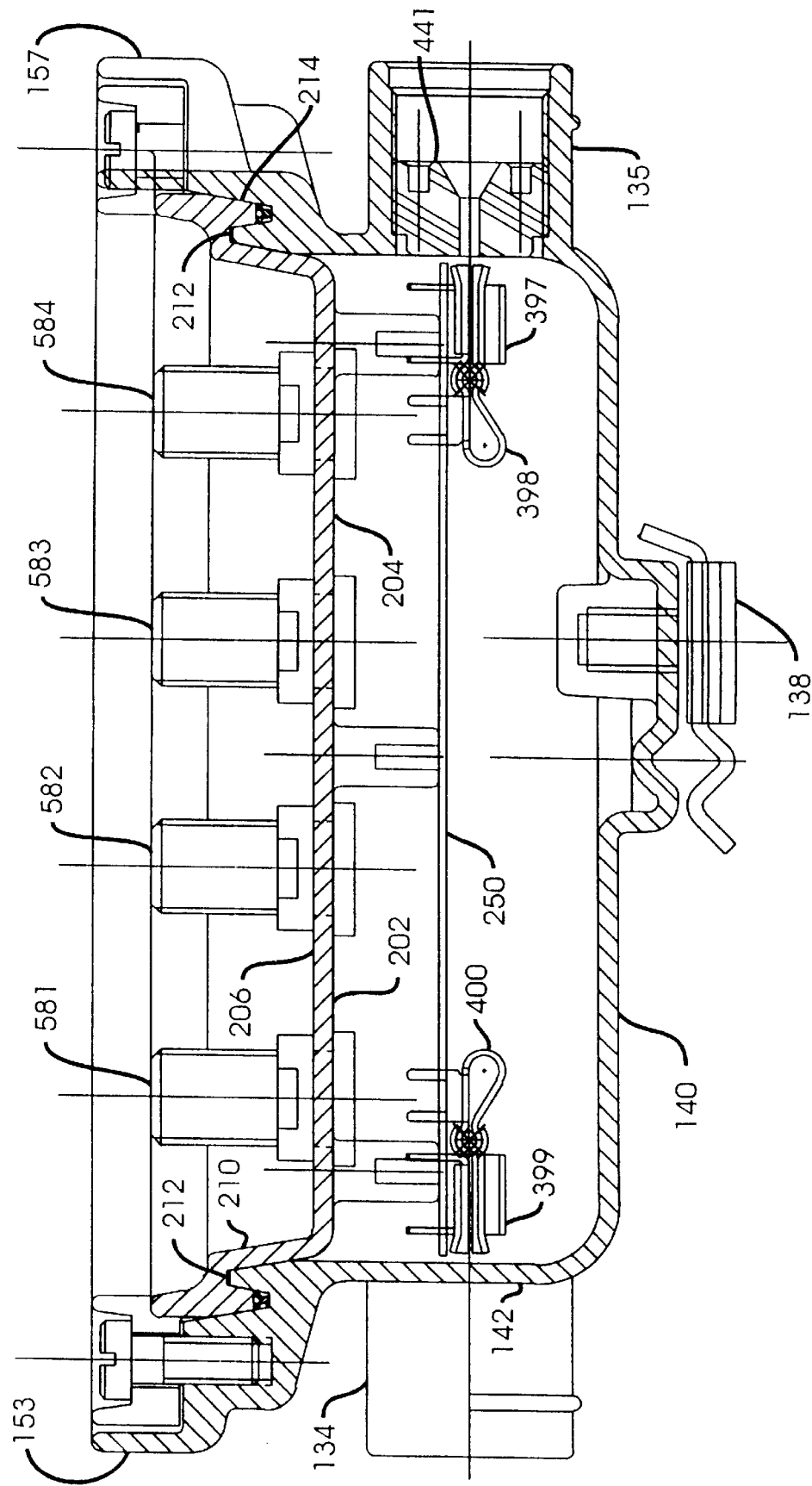
FIG. 6 is a cross sectional view taken along line 6—6 in FIG. 4 with current limiters 687 and 688 removed and with views of clips 397–400 and ports 134 and 135 added taken along line 6'—6' in FIG. 4.

Referring to FIGS. 4–6, tap case 130 includes a metal cover 200 having a bottom plate 202 defining a bottom surface 204 and a top surface 206 (FIG. 6). Cover 200 also includes a sidewall 210 that is cast to include a groove 212 defining a closed curve and a companion tongue 214 also defining a closed curve.

Referring to FIGS. 4 and 5, cover 200 also includes power distribution walls 221–224 arranged as shown. Wall 223 defines a cut-out section 226 having an upper edge 227. Wall 223 also includes a top edge 230 defining a gasket groove 232 that receives a gasket 234 having a waffle area 235 allowing for the passage of conductors and a circular cross-section area 236 that prevents rainwater from entering.

Bottom surface 204 of bottom plate 202 bears mounting studs and screws 241–244 that mount a conventional circuit board 250. Top surface 206 of bottom plate 202 bears mounting studs and screws 261 and 262 that are used to mount another circuit board 264.

Metal cover 200 is integrally formed with conventional mounting cylinders, such as cylinders 282 and 284, that receive conventional mounting bolts 302–309 that hold cover 200 securely to base 132.

Referring to FIG. 5, tap case 130 also includes a cover 320 having a top 322 and a sidewall 324 defining a lower edge 326. Cover 320 defines a cut-out section 328 having a lower edge 330 that comates with upper edge 227 to define an opening 332 for receiving twisted pair power lines 55–58 through waffle area 235 of gasket 234.

Cover 320 and cover 200 define a closed compartment 370 for housing power distribution components described hereafter. The unique shape of covers 200 and 320, as well as the configuration of gasket 234, are an important feature which prevent electromagnetic radiation from escaping compartment 370 and inhibit rainwater or other environmental contaminants from entering compartment 370.

Figure 17:
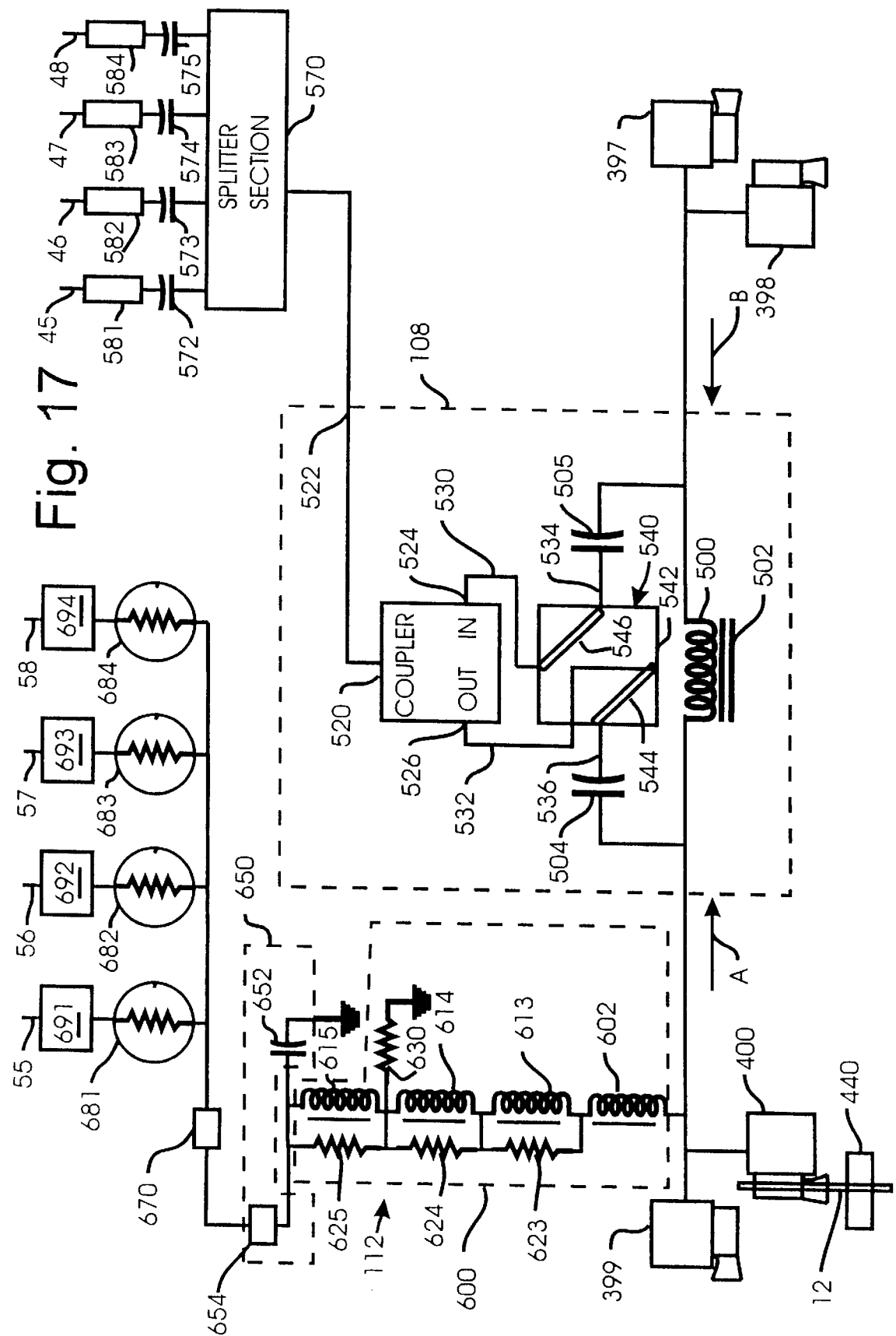
FIG. 17 is an electrical schematic block diagram showing a preferred form of circuitry made in accordance with one aspect of the invention.

Base 132 and cover 200 define another closed compartment 374 that enclose and protect many of the electrical components shown in FIG. 17. As will be explained in more detail later, the unique shapes of base 132, cover 200, and gasket 380 (FIGS. 13 and 14) prevent radio frequency electromagnetic radiation from leaving compartment 374 and prevent rainwater and other environmental contaminants from entering.

Figure 6A:
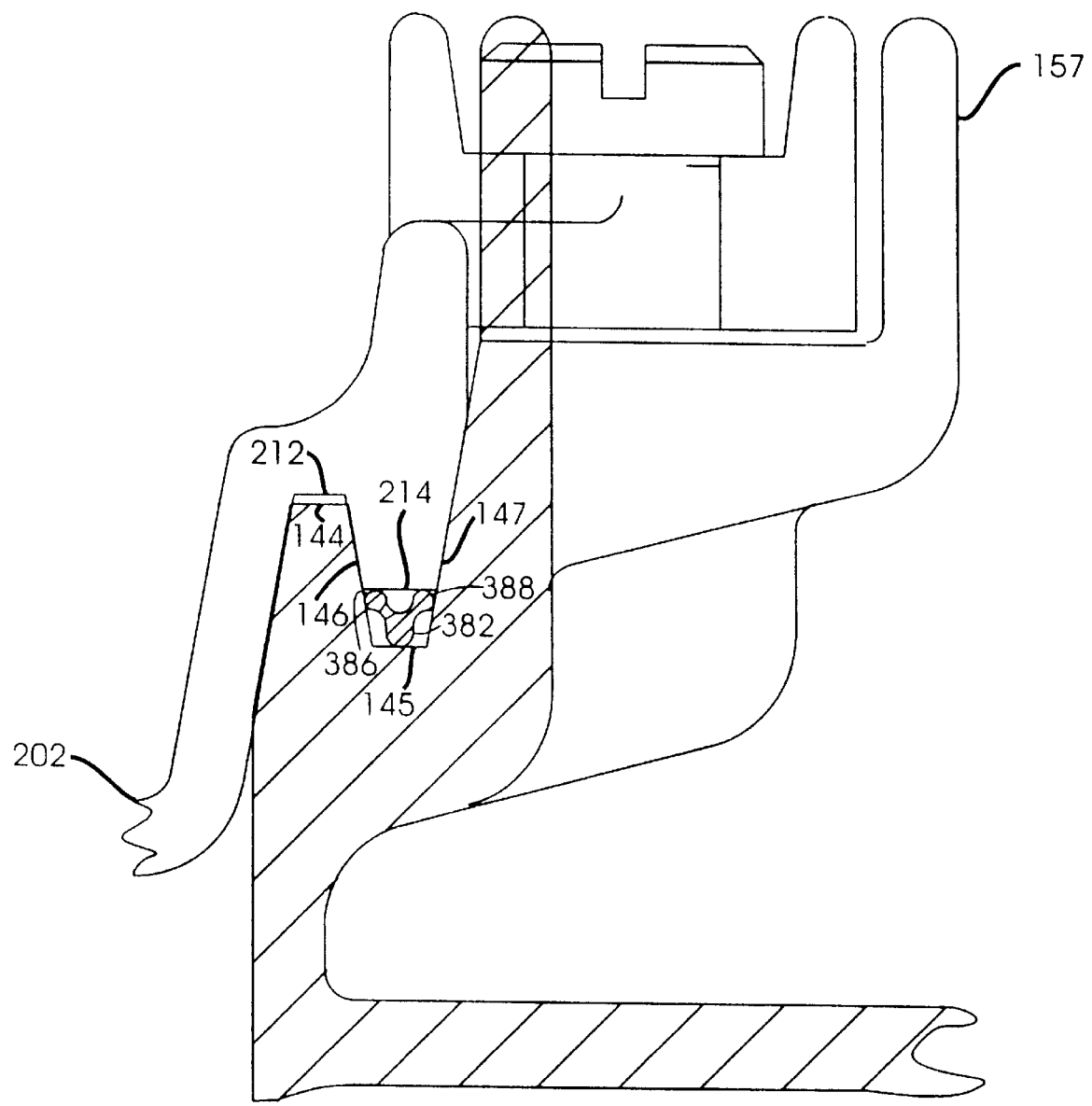
FIG. 6A is an enlarged, cross sectional view of a portion of the apparatus shown in FIG. 6.
Figure 7:
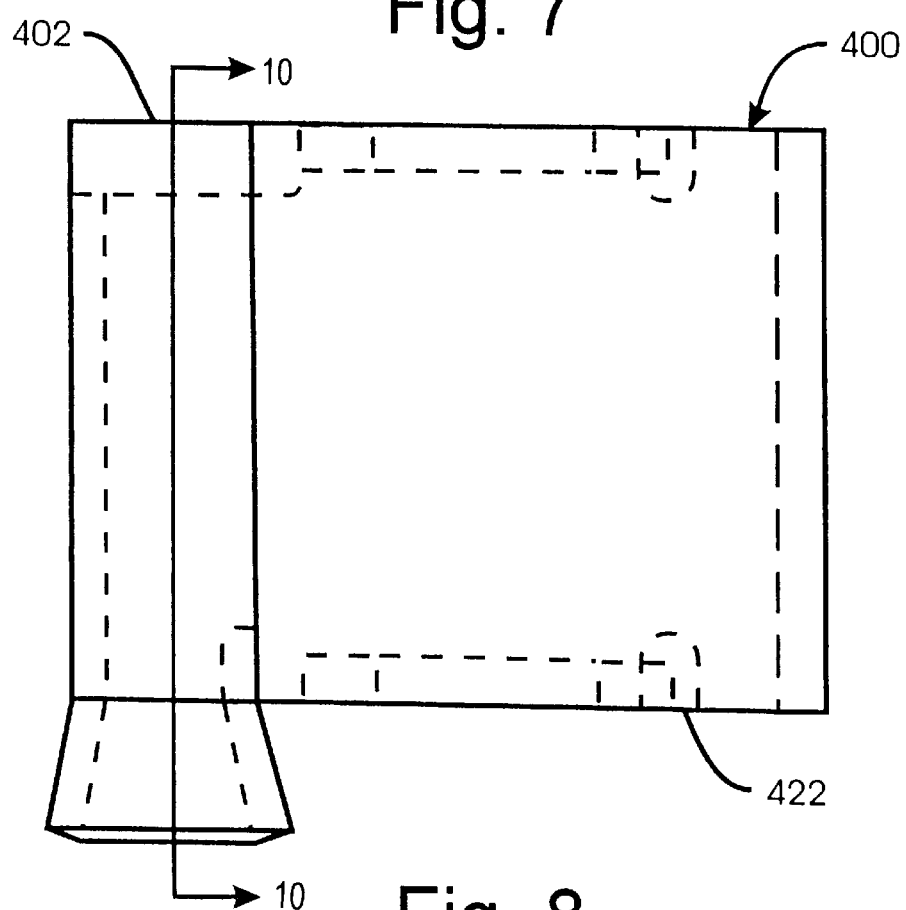
FIG. 7 is a top plan view of a preferred form of clip made in accordance with one aspect of the invention.
Figure 8:
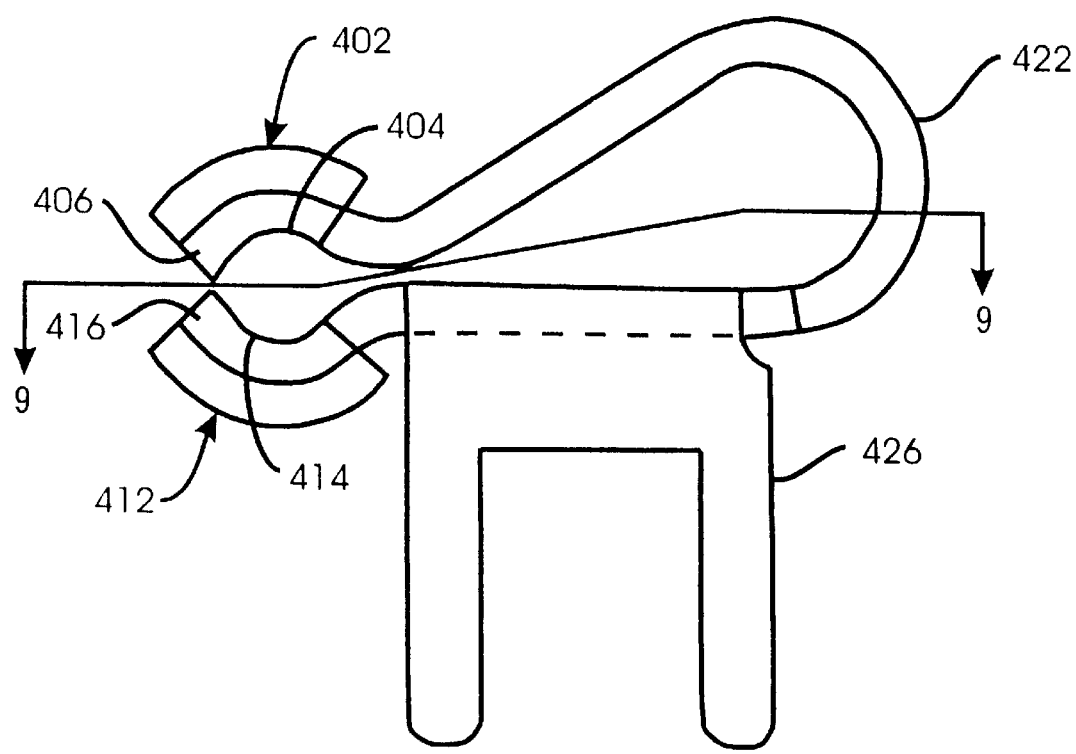
FIG. 8 is a front elevational view of the clip as shown in FIG. 7.
Figure 9:
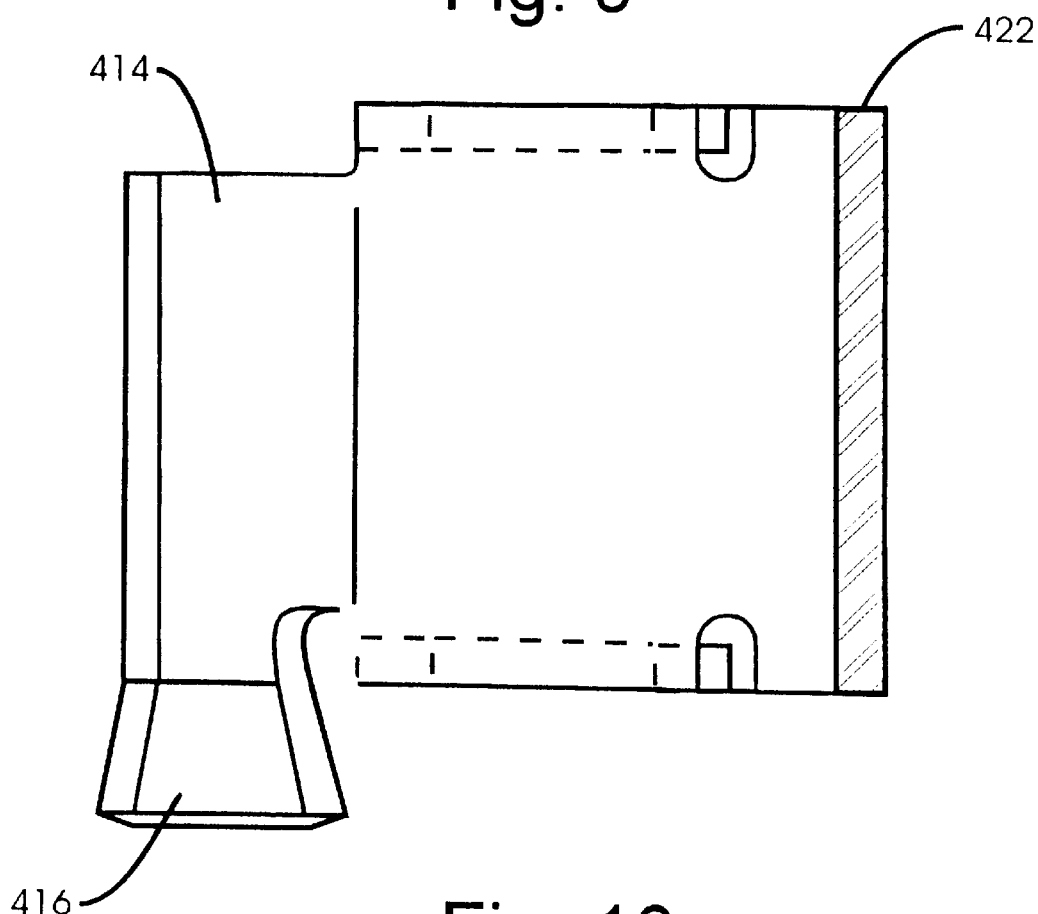
FIG. 9 is a cross sectional view taken along line 9—9 in FIG. 8.
Figure 10:
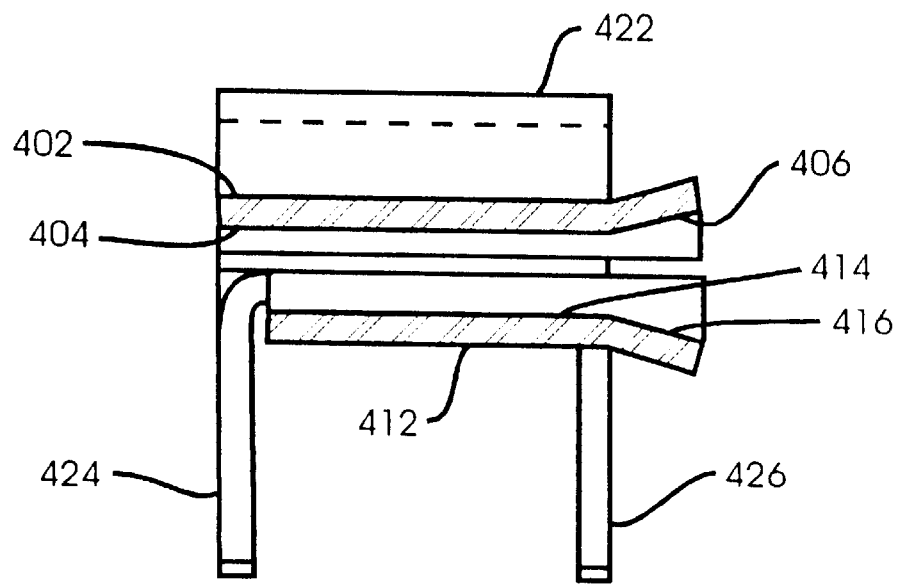
FIG. 10 is a cross sectional view taken along line 10—10 in FIG. 7.
Figure 13:
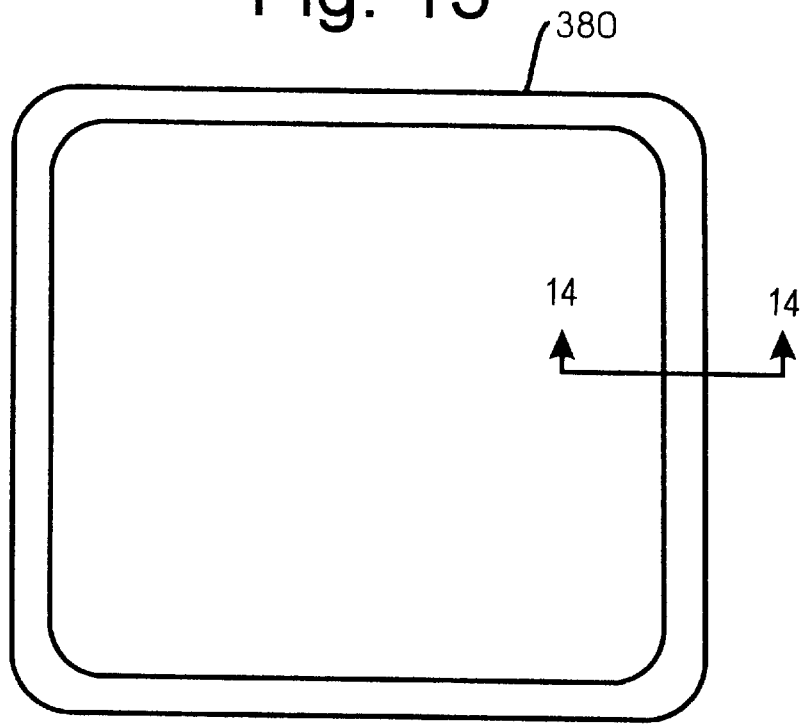
FIG. 13 is a top plan view of a preferred form of gasket for the case as shown in FIG. 5.
Figure 14:
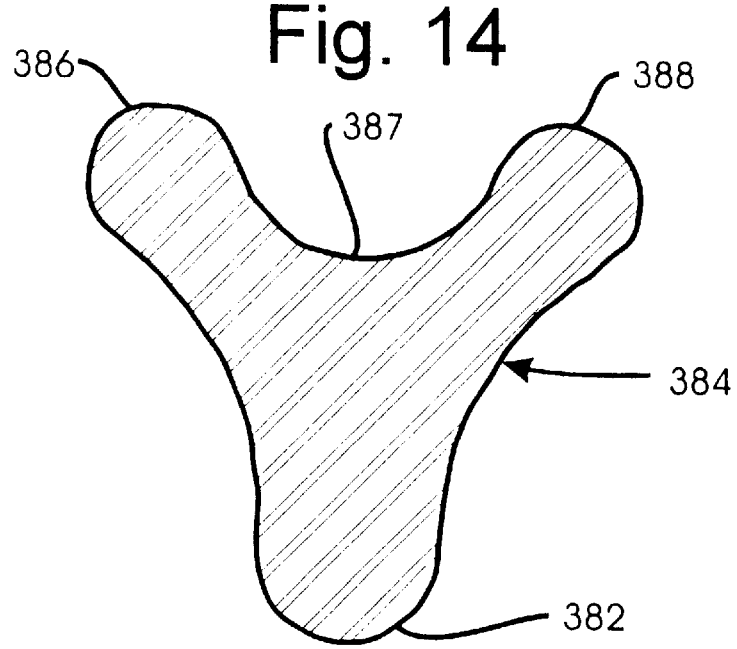
FIG. 14 is a cross sectional view taken along line 14—14 in FIG. 13.
Figure 15:
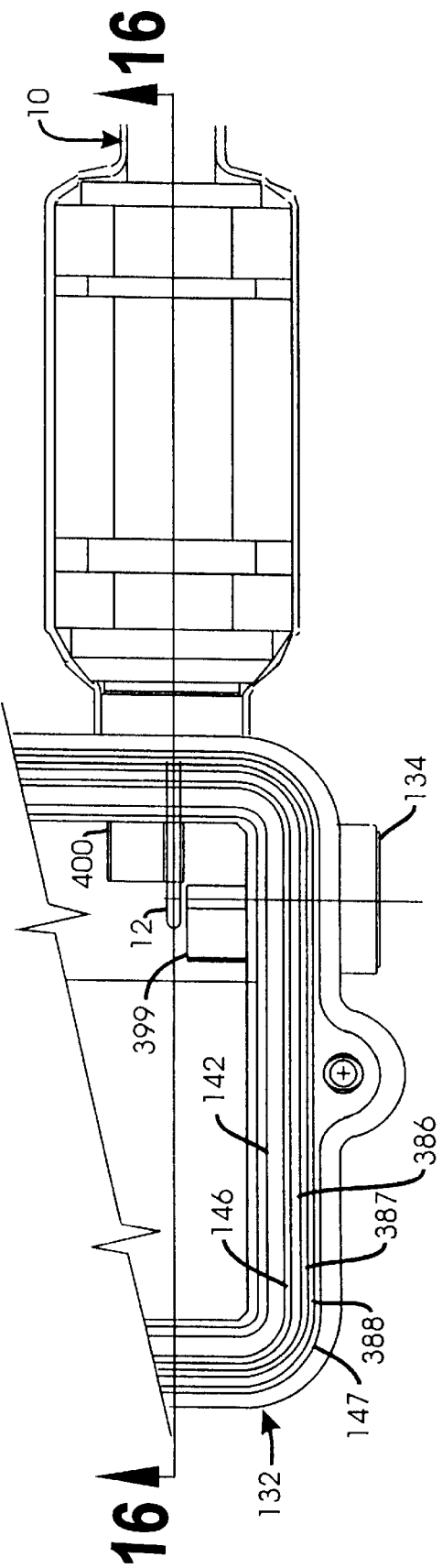
FIG. 15 is a fragmentary view of an exemplary main cable as connected to a modified form of the case as shown in FIG. 4 with the cover and top removed for clarity and with a mounting flange relocated.

Referring to FIGS. 13 and 14, gasket 380 is fabricated from ethylene-propylene and has a Y-shaped cross section. The gasket comprises a base member 382 and an upper member 384 bearing lips 386 and 388 divided by a central section 387. As shown in FIG. 6A, tongue 144 of base 132 and groove 212 of cover 200 are in contacting metal relationship in order to prevent electromagnetic radiation from leaving closed compartment 374. As further shown in FIG. 6A, tongue 214 of cover 200 urges lips 386 and 388 against sidewalls 146 and 147, respectively, of base 132 in order to provide an effective seal. The unique shape of the seal and the cooperation between base 132 and cover 200 are important features which protect circuit board 250 and the components mounted on it from environmental damage. By combining seal 384 with the tongue and groove construction of base 132 and cover 200, the applicants have been able to provide a highly economical and reliable environment for the electrical components of the tap, as shown in FIG. 17.

Referring to FIG. 17, input coupling module 106 (FIG. 2) comprises identical metal clips 397–400 interconnected as shown. Referring to FIGS. 7–10, exemplary clip 400 comprises an upper grip 402 including an upper gripping surface 404 and a upper flared surface 406. Clip 400 also includes a lower grip 412 comprising a lower gripping surface 414 and a lower flared surface 416. A spring member integrally formed with grips 402 and 412 urges gripping surfaces 404 and 414 toward each other with a predetermined force. This is an important feature which enables cable conductor 12 to be gripped with a substantially uniform capacitance between clip 400 and conductor 12.

Figure 20A:
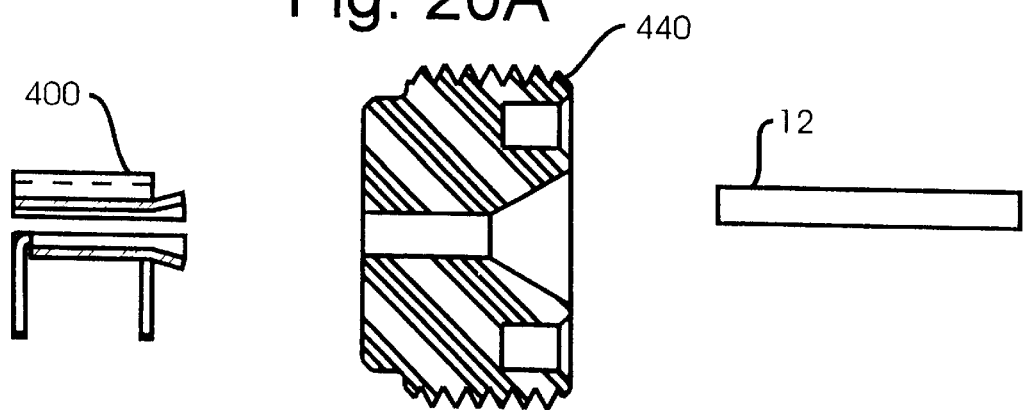
FIGS. 20A–20C are fragmentary, cross sectional views illustrating the ability of a preferred form of insert to guide a cable conductor into a preferred form of clip.
Figure 20B:
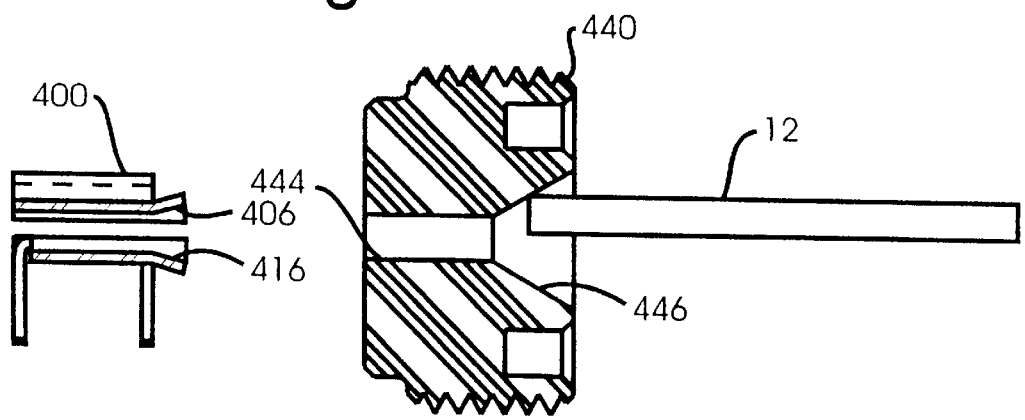
Figure 20C:
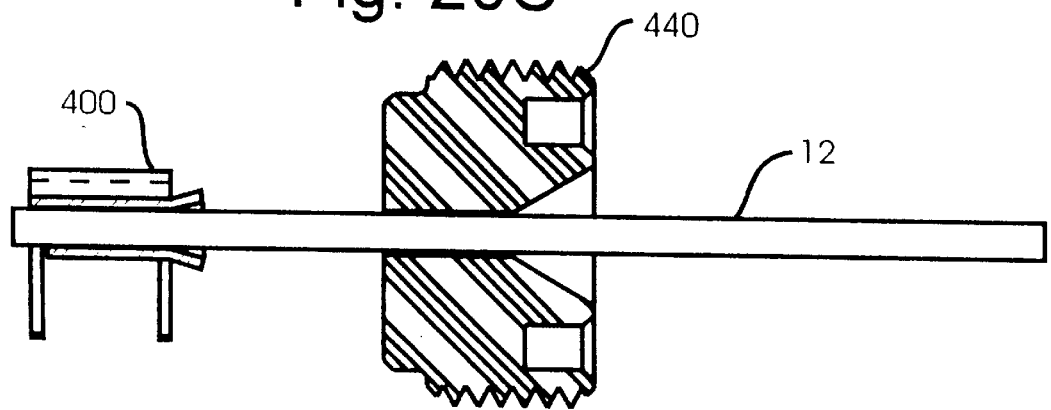

Clip 400 also includes conventional mounting legs 424 and 426 arranged as shown. The unique shape and arrangement of clip 400 also reduces the variability of the capacitance between clip 400 and conductor 12. In addition, it is very easy to insert conductor 12 into clip 400. As shown in FIGS. 20A–20C, flared surfaces 406 and 416 guide conductor 12 between grips 402 and 412 and require no tools. This is a substantial improvement over the prior connectors which require the use of screws that extend through the cable dielectric and distorted the metal of cable conductor 12. As a result, the prior connectors exhibit substantial variability from one installation to the next in the capacitance between conductor 12 and the set screws. This makes the matching of the terminal impedance presented by the circuitry to the cable center conductor very difficult. All of these difficulties have been overcome by the unique design of clip 400.

Referring to FIGS. 11 and 12, input coupling module 106 (FIG. 2) also includes an insert 440 molded from a dielectric material, such as polycarbonate. Threads 442 extend around the periphery of the generally cylindrical insert. The insert defines a hole 444 having a diameter slightly larger than the diameter of cable conductor 12. A conical funnel surface 446 guides cable conductor 12 through hole 444. Insertion holes 448 and 450 receive a tool for threading insert 440 into threads 103 of port 102 (FIG. 16). Threads 442 and 103 comate to precisely position and hold insert 440 in port 102. The unique material of the insert and its positioning relative to port 102, clip 400 and conductor 12 adjust the terminal impedance presented by input coupling module 106 and connected circuitry (FIGS. 2 and 17) to more nearly match the characteristic impedance of cable 10. Cable 10 has a nominal characteristic impedance of 75 ohms. The applicants have found that by properly positioning clip 400 and insert 440, input coupling circuit 106 can be made to present a terminal impedance quite close to 75 ohms to provide for efficient impedance matching and also to reduce wave reflections along cable 10. An insert like insert 440 may be provided in each of ports 102, 105, 134 and 136. Exemplary insert 441 is shown threaded into port 135 (FIG. 6).

As shown in FIGS. 20A–20C, insert 440 guides cable conductor 12 into port 102 and clip 400. FIG. 20A shows pin 12 approaching insert 440. FIG. 20B shows pin 12 striking funnel surface 446 which helps guide pin 12 into hole 444. FIG. 20C shows pin 12 extending through hole 444 and clip 400. This is an important feature which increases the ease and reliability of installation.

Referring to FIG. 17, subscriber video signal generator 108 comprises an inductor 500 that is coupled to a core 502, as well as capacitors 504 and 505. One example of inductor 500 and core 502 is shown in U.S. Pat. No. 5,179,334 issued Jan. 12, 1993 to Reddick.

Signal generator 108 also includes a conventional coupler 520 that receives at an input 524 a main video signal from cable 10 through either capacitor 504 or 505. Coupler 520 extracts a portion of the main video signal to generate a subscriber video signal that is transmitted through an output conductor 522 to one or more subscribers substations. The unextracted portion of the main video signal is transmitted through another output terminal 526 for transmission back to the main cable conductor. Input 524 is connected to a conductor 530 and output 526 is connected to a conductor 532. Conductor 534 is coupled through capacitor 505 to port 135 or port 105. A conductor 536 is coupled through capacitor 504 to port 102 or port 134.

A reversing connector 540 enables the main video signal from the main cable to be transmitted to input 524 irrespective of whether the video signal is traveling in the direction of arrow A or in the direction of arrow B. Connector 540 includes a base 542 and conductors 544 and 546 mounted on the base. As shown in FIG. 19, conductor 544 is arranged to electrically interconnect pins 552 and 553, and conductor 546 is arranged to electrically interconnect pins 551 and 554. Conductors 530, 532, 534 and 536 preferably are arranged to terminate in the sockets which comate with pins 551–554.

Assuming the main video signal is conducted in the direction of arrow B, the signal is transmitted through capacitor 505, conductor 534, conductor 546, and conductor 530 to input 524. The unextracted portion of the main video signal is conducted through output terminal 526, conductor 532, conductor 544, conductor 536 and capacitor 504 to clip 400 connected to port 102 or clip 399 connected to port 134.

If the main video signal is proceeding in the direction indicated by arrow A, reversing connector 540 is rotated 90° to the position shown in FIG. 18. Assuming the main video signal is conducted in the direction shown by arrow A, it is transmitted through capacitor 504, conductor 536, conductor 546, and conductor 530 to input 524. The unextracted portion of the main video signal is transmitted through output terminal 526, conductor 532, conductor 544, conductor 534 and capacitor 504 to clip 397 connected to port 135 or clip 398 and connected to port 105.

By merely rotating reversing connector 540, the main video signal is conducted to the input of coupler 520 irrespective of the direction in which the video signal is transmitted on the main cable. This is an important feature which enables a tap and drop lines to subscriber substations to be used effectively by merely reversing a connector in the event that the direction of the video signal on the main cable must be reversed.

Referring to FIG. 17, video transmitter 110 comprises a conventional splitter section 570 that splits the extracted video signal on conductor 522 into a number of lines for transmission to one to eight subscriber substations. In the embodiment shown in FIG. 17, the extracted video signal is split into four outputs. Each of the outputs is connected in series with a capacitor, such as capacitors 572–575 in the manner shown. The capacitors, in turn, are connected to F connectors 581–584. An exemplary F connector is shown in U.S. Pat. No. 5,096,444 issued Mar. 17, 1992 to Lu et al.

Additional F connectors can be provided for up to eight subscriber substations.

As shown in FIG. 4, tap case 130 is capable of accommodating eight F connectors 581–588 in the positions shown. As shown in FIG. 6, the F connectors are carried on base plate 202 of cover 200.

Capacitors 572–575 are an important feature that prevent hum modulation distortion of the subscriber video signal. Referring to FIG. 1, 60 cycle current may be induced in conductor 45 due to the imbalance between the potential at ground point 18 and the potential at ground point 40. This problem is particularly acute in locations having a sandy soil where it is difficult to achieve good grounding. The induced current typically flows in the direction of arrow A along conductor 45 and returns to the subscriber's station on shield 50 in the direction of arrow B. The induced current then flows through a conductor 590 that connects the shield to the subscriber substation ground block. The induced current then returns through an appliance in subscriber substation to conductor 45 and again flows in the direction of arrow A toward tap 100.

Those skilled in the art will recognize that connecting capacitor 572 in series with conductor 45 prevents the induced current from flowing in conductor 45. Capacitor 572 acts as a high pass filter that allows the video signal to proceed along conductor 45 but prevents any substantial portion of a 60 cycle signal from being transmitted. Preferably, the capacitor 572 comprises a 60 hertz filter. Additional capacitors 582–584 operate the same way in connection with lines 46–48, respectively.

Still referring to FIG. 17, subscriber power signal generator 112 comprises a power extraction circuit 600 that includes an inductor 602 coupled directly to clips 399 and 400. Inductor 602 is an important feature which acts as a buffer which appears as a relatively small inductance to radio frequencies in the pass band.

Power extraction circuit 600 also comprises inductor-resistor pairs including inductors 613–615 and paired resistors 623–625, respectively. The resistors are used to tune the resonant frequency of the inductor-resistor pairs outside the pass band of the cable (e.g., outside 5 megahertz–1 gigahertz). Each of inductors 602 and 613–615 are fitted with ferro magnetic cores. A resistor 630 is connected as shown in order to suppress the transmission of energy in the pass band.

Generator 112 also includes a filter circuit 650. A capacitor 652 is connected as shown in order to conduct radio frequency energy to ground. A pi filter 654 is connected as shown to further filter radio frequency energy from the output of power extraction circuit 600. The pi filter preferably is part No. 4202-001 made by Tusconix Filters.

Each of resistors 623–625 and 630 has a value of 1 K ohms. Each of inductors 602 and 613–615 with its associated core has a value of approximately 2.7 micro henry. Capacitor 652 has a value of 6800 pico farads.

Power extraction circuit 600 is an important feature which absorbs less than 0.2 decibels of radio frequency energy and induces no suckout of radio frequency energy in the cable pass band.

The components of subscriber video signal generator 108, splitter section 570, capacitors 572–575, power extraction circuit 600, and filter circuit 650 all are located on circuit board 250 located within closed compartment 374 (FIGS. 5 and 6). This is an important feature which prevents radio frequency energy from being emitted into the environment and protects the electrical components.

The output of filter circuit 650 is conducted through a fusible link 670 which is made of metal that readily melts, thereby producing an open circuit, when the electrical power exceeds a predetermined safe level. The output of link 670 is transmitted through positive temperature coefficient current limiters 681–684. This is an important feature which prevents excessive current from being transmitted to subscriber substations, but which allows the circuitry to reactivate in the event that safe current levels are available at a later time. Tap case 130 can accommodate four additional current limiters 685–688. As shown in FIG. 4, current limiters 681–688 are mounted in closed compartment 370 on circuit board 264.

The output of each of the current limiters is connected to conventional twisted pair connectors 691–694. Tap case 130 can accommodate four additional connectors 695–698 that are connected to circuit board 264 in the position shown in closed compartment 370 (FIGS. 4 and 5).

During installation, twisted pair lines 55–58 are connected to connectors 691–694 by an installer. During installation, cover 320 is removed to expose the connectors. Twisted line pairs 55–58 are extended through waffle area 235 of gasket 234 (FIGS. 4 and 5) and are connected to their respective connectors. Cover 320 is then reinstalled on the case to seal all of the components on circuit board 264 from the weather, and also to prevent any residual radio frequency energy from being emitted from closed compartment 370. Very little radio frequency energy, if any, is within compartment 370 because of the filtering action of filter circuit 650.

Those skilled in the art will recognize that the preferred embodiments may be altered or amended without departing from the true spirit or scope of the invention as defined in the accompanying claims.

We claim:

1. In a system for distributing information to subscriber substations, including a main cable for transmitting a main video signal and a main power signal on a cable conductor having a predetermined cable characteristic impedance, an improved tap for extracting a main video signal and AC power from the main cable, and for delivering a portion of said main video signal and AC power to the subscriber substations comprising in combination:

first means for coupling said main video signal and said main power signal from said cable conductor to said tap;

means for generating a subscriber video signal by extracting a predetermined portion of said main video signal received from said first means;

means for transmitting said subscriber video signal to at least one of said subscriber substations on at least a first subscriber video cable;

means for generating a subscriber power signal by extracting a predetermined portion of said main power signal received from said first means;

means for transmitting said subscriber power signal to at least one of said subscriber substations on at least a first subscriber power line; and second means for coupling the unextracted portion of said main video signal and said main power signal to a second main cable, whereby communication devices in said subscriber substations can be powered by said subscriber power signal in the absence of electrical power from a power utility.

2. Apparatus, as claimed in claim 1, wherein said first means for coupling presents a predetermined terminal impedance to said main cable different from said characteristic impedance and wherein said first means for coupling comprises means for gripping said cable conductor with a predetermined pressure, whereby the variability of capacitance between said means for gripping and said cable conductor is reduced.

3. Apparatus, as claimed in claim 2, wherein said first means for coupling comprises at least one metal clip for gripping said cable conductor.

4. Apparatus, as claimed in claim 3, wherein said clip comprises first and second opposed gripping surfaces and a spring section for urging said first and second surfaces toward each other with a predetermined force.

5. Apparatus, as claimed in claim 4, wherein said first and second gripping surfaces and said spring section are integrally formed.

6. Apparatus, as claimed in claim 5, wherein said first and second gripping surfaces terminate in outwardly flared sections for guiding said cable conductor between said first and second gripping surfaces.

7. Apparatus, as claimed in claim 2, wherein said first means for coupling comprises an insert for guiding said cable conductor into said means for gripping and for adjusting said terminal impedance to more nearly equal said characteristic impedance.

8. Apparatus, as claimed in claim 7, wherein said insert is integrally fabricated from a dielectric material.

9. Apparatus, as claimed in claim 8, wherein said dielectric material is polycarbonate.

10. Apparatus, as claimed in claim 7, wherein said tap comprises a port for receiving said cable conductor and wherein said insert comprises a generally cylindrical body adapted to be received within said port, said body defining a hole having a diameter larger than the diameter of said cable conductor and a generally conical funnel for guiding said cable conductor through said hole.

11. Apparatus, as claimed in claim 1, wherein said tap comprises:

a housing comprising a metal cover including a first groove defining a closed curve and a first tongue also defining a closed curve, a metal base including a second groove defining a closed curve and a second tongue also defining a closed curve, said second tongue being inserted in said first groove in contacting relationship; and an integrally formed seal having a first member inserted in said second groove and having a second member engaged by said first tongue, whereby said cover and said base define a closed chamber for enclosing said means for generating a subscriber video signal and said means for generating a subscriber power signal so that said contacting relationship of said second tongue and said first groove confine electromagnetic radiation in said closed chamber and said seal inhibits water from entering said closed chamber.

12. Apparatus, as claimed in claim 11, wherein said seal has a generally Y-shaped cross section.

13. Apparatus, as claimed in claim 12, wherein said second groove comprises a generally inverted trapezoidal shape in cross section.

14. Apparatus, as claimed in claim 13, wherein said second groove defines a first sidewall and a second sidewall and wherein said second member of said seal comprises a first portion urged into contact with said first sidewall by said first tongue and further comprises a second portion urged into contact with said second sidewall by said first tongue.

15. Apparatus, as claimed in claim 12, wherein said seal is fabricated from ethylene-propylene.

16. Apparatus, as claimed in claim 1, wherein said means for generating a subscriber video signal comprises a coupler comprising an input for receiving said main video signal, a first output for transmitting said extracted predetermined portion of said main video signal to a subscriber and a second output for transmitting an unextracted portion of said main video signal to said second means for coupling.

17. Apparatus, as claimed in claim 16, and further comprising means for reversing connections between said first and second means for coupling, said input of said coupler and said second output of said coupler.

18. Apparatus, as claimed in claim 17, wherein said means for reversing connections comprises:

a first conductor coupled to said input of said coupler;

a second conductor coupled to said second output of said coupler;

a third conductor coupled to said first coupling means;

a fourth conductor coupled to said second coupling means;

a base movable between first and second positions;

a fifth conductor mounted on said base operable when said base is in said first position for coupling said first and fourth conductors and operable when said base is in said second position for coupling said first and third conductors; and a sixth conductor mounted on said base operable when said base is in said first position for coupling said second and third conductors and operable when said base is in said second position for coupling said second and fourth conductors so that by moving said base between said first and second positions said main video signal can be coupled to said input of said coupler irrespective of whether said main video signal is received through said first coupling means or through said second coupling means.

19. Apparatus, as claimed in claim 1, wherein said main video signal has a predetermined pass band and wherein said means for generating a subscriber power signal comprises power extraction means having a resonant frequency outside said pass band.

20. Apparatus, as claimed in claim 19, wherein said power extraction means comprises:

first inductor means coupled to said first means for coupling for buffering said main video signal;

a plurality of second inductor means, each of said second inductor means comprising an inductor, a core and a resistor for tuning said resonant frequency outside said pass band.

21. Apparatus, as claimed in claim 20, wherein said first inductor means is connected in series with said plurality of said second inductor means.

22. Apparatus, as claimed in claim 21 and further comprising a resistor connected to one of said second inductor means for suppressing the transmission of energy in said pass band by said power extraction means.

23. Apparatus, as claimed in claim 21, and further comprising filter means for filtering frequencies in said pass band from signals generated by said means for generating a subscriber power signal.

24. Apparatus, as claimed in claim 23 wherein said filter means comprises:

capacitor coupled between one of said second inductor means and ground potential; and a pi filter coupled to the output of said plurality of said second inductor means.

25. Apparatus, as claimed in claim 1, wherein said means for transmitting said subscriber power signal comprises means for limiting current.

26. Apparatus, as claimed in claim 25, wherein said means for limiting current is connected in series with said means for generating a subscriber power signal.

27. Apparatus, as claimed in claim 25, wherein said means for limiting current comprises a positive temperature coefficient current limiter.

28. Apparatus, as claimed in claim 27, wherein said means for limiting current further comprising a circuit breaker connected in series with said current limiter.

29. Apparatus, as claimed in claim 28, wherein said circuit breaker comprises a fusible link.

30. Apparatus, as claimed in claim 1, wherein said main cable comprises a first shield connected to ground at a predetermined location remote from said subscriber substation, wherein said subscriber substation comprises a subscriber ground connection connected to ground adjacent said subscriber substation, and wherein said means for transmitting said subscriber video signal comprises:

a line having a second shield connected to said subscriber ground connection and a line signal conductor for transmitting said subscriber video signal to said subscriber substation; and high pass filter means for filtering frequencies below said pass band from said line signal conductor, whereby hum modulation distortion of said subscriber video signal is reduced.

31. Apparatus, as claimed in claim 30, wherein said high pass filter means comprises means for filtering 60 Hz signals.

32. Apparatus, as claimed in claim 31, wherein said high pass filter means comprises a capacitor connected in series with said line signal conductor.

33. In a tap for delivering video signals to subscriber substations from a main cable transmitting a main video signal having a predetermined pass band and a main power signal on a cable conductor, said tap including a coupler for generating a subscriber video signal by extracting a predetermined portion of said main video signal, improved apparatus for supplying power to subscriber substations from said main cable comprising in combination:

means for generating a subscriber power signal by extracting a predetermined portion of said main power signal, said means for generating having a resonant frequency outside said pass band; and means for transmitting said subscriber power signal to said subscriber substations.

34. Apparatus, as claimed in claim 33, wherein said means for generating comprises:

first inductor means coupled to said cable conductor for buffering said main video signal;

a plurality of second inductor means, each of said second inductor means comprising an inductor, a core and a resistor for tuning said resonant frequency outside said pass band.

35. Apparatus, as claimed in claim 34, wherein said first inductor means is connected in series with said plurality of said second inductor means.

36. Apparatus, as claimed in claim 34, and further comprising a resistor connected to one of said second inductor means for suppressing the transmission of energy in said pass band by said means for generating.

37. Apparatus, as claimed in claim 34, and further comprising filter means for filtering frequencies in said pass band from signals generated by said means for generating a subscriber power signal.

38. Apparatus, as claimed in claim 37, wherein said filter means comprises:

capacitor coupled between one of said second inductor means and ground potential; and a pi filter coupled to the output of said plurality of said second inductor means.

39. Apparatus, as claimed in claim 33, wherein said means for transmitting said subscriber power signal comprises means for limiting current.

40. Apparatus, as claimed in claim 39, wherein said means for limiting current is connected in series with said means for generating a subscriber power signal.

41. Apparatus, as claimed in claim 39, wherein said means for limiting current comprises a positive temperature coefficient current limiter.

42. Apparatus, as claimed in claim 41, wherein said means for limiting current further comprising a circuit breaker connected in series with said current limiter.

43. Apparatus, as claimed in claim 42, wherein said circuit breaker comprises a fusible link.

44. In a tap for delivering video signals to subscriber substations from a main cable transmitting a main video signal and a main power signal on a cable conductor, said tap including a coupler for generating a subscriber video signal by extracting a predetermined portion of said main video signal, said main cable comprising a first shield connected to ground at a predetermined location remote from said subscriber substation, said subscriber substation comprising a subscriber ground connection connected to ground adjacent said subscriber substation, improved apparatus for transmitting said extracted predetermined portion of said main video signal to said subscriber substations comprising in combination:

a line having a second shield connected to said subscriber ground connection and a line signal conductor for transmitting said subscriber video signal to said subscriber substation; and high pass filter means for filtering frequencies below said pass band from said line signal conductor, whereby hum modulation distortion of said subscriber video signal is reduced.

45. Apparatus, as claimed in claim 44, wherein said high pass filter means comprises means for filtering 60 Hz signals.

46. Apparatus, as claimed in claim 45, wherein said high pass filter means comprises a capacitor connected in series with said line signal conductor.

* * * * *